United States Patent
Guo

(10) Patent No.: US 10,461,728 B2
(45) Date of Patent: Oct. 29, 2019

(54) SEMI-CONTROLLABLE DEVICE DRIVING METHOD AND APPARATUS, AND HYBRID DEVICE

(71) Applicant: Qiaoshi Guo, Guangdong (CN)

(72) Inventor: Qiaoshi Guo, Guangdong (CN)

(73) Assignee: Qiaoshi Guo, Guangdong (CN)

( * ) Notice: Subject to any disclaimer, the term of this patent is extended or adjusted under 35 U.S.C. 154(b) by 0 days.

(21) Appl. No.: 16/072,147

(22) PCT Filed: Jan. 22, 2017

(86) PCT No.: PCT/CN2017/072027
§ 371 (c)(1),
(2) Date: Jul. 23, 2018

(87) PCT Pub. No.: WO2017/125085
PCT Pub. Date: Jul. 27, 2017

(65) Prior Publication Data
US 2019/0052255 A1     Feb. 14, 2019

(30) Foreign Application Priority Data

Jan. 24, 2016  (CN) .......................... 2016 1 0070145
Feb. 26, 2016  (CN) .......................... 2016 1 0117432
(Continued)

(51) Int. Cl.
*H03K 17/04* (2006.01)
*H03K 17/13* (2006.01)
*H03K 17/30* (2006.01)

(52) U.S. Cl.
CPC ....... *H03K 17/0403* (2013.01); *H03K 17/136* (2013.01); *H03K 2017/307* (2013.01)

(58) Field of Classification Search
CPC .. H03K 17/0412; H03K 17/136; H03K 17/16; H03K 17/163; H03K 17/51; H03K 17/567; H03K 17/60
USPC .......................... 327/108, 109, 110, 111, 112
See application file for complete search history.

(56) References Cited

U.S. PATENT DOCUMENTS 3,917,962 A * 11/1975 Pascente .............. H03K 17/136
                                                     323/319
5,233,495 A    8/1993 De Palma et al.
(Continued)

FOREIGN PATENT DOCUMENTS

CN       101699686 A       4/2010
CN       102244510 A       11/2011
(Continued)

OTHER PUBLICATIONS

International Search Report and Written Opinion for International Application No. PCT/CN2017/072027 dated Apr. 25, 2017.
(Continued)

*Primary Examiner* — John W Poos
(74) *Attorney, Agent, or Firm* — Wolf, Greenfield & Sacks, P.C.

(57) ABSTRACT

A semi-controllable device driving method and apparatus and a hybrid device of the present disclosure belong to the electrical field, and are particularly a driving method, with no driving dead zone or with an extremely small driving dead zone, that is applicable to a semi-controllable device such as a thyristor; a semi-controllable driving apparatus, with no conduction dead zone or with an extremely small conduction dead zone, that is applicable to a driving loop of a semi-controllable device such as a thyristor; and a hybrid device with no conduction dead zone or with an extremely small conduction dead zone. In the semi-controllable device driving method, a voltage detection switch is used; an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned off after detecting that the semi-controllable device is turned on. The present disclosure has an advantage of no driving dead zone or an extremely small driving dead zone.

13 Claims, 8 Drawing Sheets

(30) Foreign Application Priority Data

| | | |
|---|---|---|
| Aug. 10, 2016 | (CN) | 2016 1 0647521 |
| Aug. 30, 2016 | (CN) | 2016 1 0758333 |
| Oct. 12, 2016 | (CN) | 2016 1 0889588 |
| Nov. 22, 2016 | (CN) | 2016 1 1030829 |
| Jan. 16, 2017 | (CN) | 2017 1 0028032 |

(56) References Cited

U.S. PATENT DOCUMENTS

| | | |
|---|---|---|
| 6,634,298 B1 | 10/2003 | Dennet |
| 2017/0353180 A1 | 12/2017 | Guo |

FOREIGN PATENT DOCUMENTS

| | | |
|---|---|---|
| CN | 202435365 U | 9/2012 |
| CN | 104135257 A | 11/2014 |
| CN | 205407772 U | 7/2016 |
| CN | 206364781 U | 7/2017 |
| JP | S55-147830 A | 11/1980 |
| JP | H3-45012 A | 2/1991 |
| JP | H03-70208 A | 3/1991 |
| JP | H6-140899 A | 5/1994 |
| WO | WO 2015/131693 A1 | 9/2015 |
| WO | WO 2018-161833 A1 | 9/2018 |

OTHER PUBLICATIONS

Japanese communication for Application No. JP 2018-557184 dated Jun. 28, 2019.

* cited by examiner

SEMI-CONTROLLABLE DEVICE DRIVING METHOD AND APPARATUS, AND HYBRID DEVICE

RELATED APPLICATIONS

This application is a 35 U.S.C. § 371 national stage filing of International Application No. PCT/CN2017/072027, filed on Jan. 22, 2017, which claims priority to Chinese Patent Application No. 201610070145.8, filed on Jan. 24, 2016, No. 201610117432.X, filed on Feb. 26, 2016, No. 201610647521.5, filed on Aug. 10, 2016, No. 201610758333.X, filed on Aug. 30, 2016, No. 201610889588.X, filed on Oct. 12, 2016, No. 201611030829.1, filed on Nov. 22, 2016, and No. 201710028032.6, filed on Jan. 16, 2017. The entire contents of each of the foregoing applications are incorporated herein by reference.

TECHNICAL FIELD

A semi-controllable device driving method and apparatus of the present disclosure belong to the electrical field, and are particularly a driving method, with no driving dead zone or with an extremely small driving dead zone, that is applicable to a semi-controllable device such as a thyristor; a semi-controllable driving apparatus, with no driving dead zone or with an extremely small driving dead zone, that is applicable to a driving loop of a semi-controllable device such as a thyristor; and a hybrid device with no conduction dead zone or with an extremely small conduction dead zone.

BACKGROUND

At present, in an electric control system in which load needs to be frequently switched, thyristors (semi-controllable devices) are widely used to switch resistive, inductive, or capacitive load. To reduce driving power of a thyristor, a related technology used to reduce driving energy consumption emerges in the market, for example, a patent with Chinese Patent Application No. ZL201110430747.7 and entitled "TRIGGER POWER-SAVING APPARATUS AND THYRISTOR SWITCH". A working principle disclosed by the patent is: A voltage detection circuit controls an electronic switch to be turned on when detecting that voltage at two ends of a main loop of a thyristor is greater than an on-state voltage (generally 1.1-1.9 V and defined as a conduction voltage drop in an original document) of the thyristor; a driving signal drives, by using the electronic switch, the thyristor to be turned on; and the voltage detection circuit controls the electronic switch to be turned off when detecting that the thyristor is turned on. Although the patent has a smaller driving dead zone compared with a conventional thyristor driving manner, the patent still has the following disadvantage: The voltage detection circuit controls the electronic switch to be turned on only when detecting that the voltage at the two ends of the main loop of the thyristor is greater than the on-state voltage of the thyristor. Because the driving signal of the thyristor is provided in a lagged manner, a driving dead zone objectively exists. In addition, there is a response time from obtaining, by the thyristor, the driving signal from a trigger of the thyristor to conduction output of the thyristor. Theoretically, the thyristor cannot be driven with no dead zone or with a smaller dead zone. Refer to a diagram of a waveform of the voltage at the two ends when the thyristor is turned on in this technology (as shown in FIG. 1).

SUMMARY

An objective of the present disclosure is to provide a driving method that makes a semi-controllable device such as a thyristor have no conduction dead zone or have an extremely small conduction dead zone; a semi-controllable device driving apparatus, with no driving dead zone or with an extremely small driving dead zone, that is applicable to a driving loop of a semi-controllable device such as a thyristor; and a hybrid device with no conduction dead zone or with an extremely small conduction dead zone, so as to resolve a disadvantage of existing thyristor driving.

To achieve the objective of the present disclosure, the present disclosure describes a semi-controllable device driving method, wherein a voltage detection switch is used; an input end of the voltage detection switch is connected to two ends of a semi-controllable device that needs to be driven; the voltage detection switch is connected, in series, in a driving loop of the semi-controllable device; the voltage detection switch is turned on when the potential difference at the two ends of the semi-controllable device is not greater than an on-state voltage of the semi-controllable device; and the voltage detection switch is turned off after detecting that the semi-controllable device is turned on.

In the semi-controllable device driving method, the voltage detection switch is turned on when the potential difference at the two ends of the semi-controllable device is greater than 0 and meets a voltage direction in which the semi-controllable device is turned on.

The present disclosure further describes a semi-controllable device driving apparatus, comprising a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when the potential difference at the two ends of the semi-controllable device is not greater than an on-state voltage of the semi-controllable device; and the voltage detection switch is turned off when the semi-controllable device is on.

In the semi-controllable device driving apparatus, there is no insulated isolation between an input loop of the voltage detection switch, an output loop of the voltage detection switch, and the semi-controllable device; and the voltage detection switch is turned on when the potential difference at the two ends of the semi-controllable device is greater than 0 and meets a voltage direction in which the semi-controllable device is turned on.

The present disclosure further describes a semi-controllable device driving apparatus, comprising a first capacitor and a semiconductor switch; wherein the voltage signal at the two ends of the semi-controllable device that needs to be driven is transferred to a control end of the semiconductor switch by using the first capacitor; and the semiconductor switch is connected, in series, in the driving loop of the semi-controllable device.

In the semi-controllable device driving apparatus, the semiconductor switch is turned on when the potential difference at the two ends of the semi-controllable device is less than the on-state voltage of the semi-controllable device and a direction of the potential difference at the two ends of the semi-controllable device meets a voltage direction in which the semi-controllable device is turned on; and the semiconductor switch is turned off after the semi-controllable device is turned on.

In the semi-controllable device driving apparatus, the semi-controllable device is a unidirectional thyristor or a bidirectional thyristor.

In the semi-controllable device driving apparatus, a series circuit formed by a resistor and a semiconductor device that are connected in series is further comprised; the series circuit and the first capacitor are connected in parallel; and a current passing through the series circuit is used to control the semiconductor switch to be turned on when the potential difference at the two ends of the semi-controllable device is greater than the on-state voltage of the semi-controllable device.

In the semi-controllable device driving apparatus, the semiconductor switch is formed by a semiconductor device and a resistor.

In the semi-controllable device driving apparatus, the semiconductor switch is a first transistor, and comprises a detection circuit; an input end of the detection circuit is connected to a first end of the semi-controllable device; an output end of the detection circuit is connected to a second end of the first transistor by using the first capacitor; and a first end of the first transistor and a third end of the first transistor are connected, in series, in the driving loop of the semi-controllable device.

In the semi-controllable device driving apparatus, the semiconductor switch comprises a first transistor and a detection circuit; an input end of the detection circuit is connected to a first end of the semi-controllable device by using the first capacitor; an output end of the detection circuit is connected to a second end of the first transistor; and a first end of the first transistor and a third end of the first transistor are connected, in series, in the driving loop of the semi-controllable device.

In the semi-controllable device driving apparatus, the detection circuit at least comprises a common-emitter circuit.

In the semi-controllable device driving apparatus, the semi-controllable device is a unidirectional thyristor; the first transistor is a PNP transistor; the detection circuit comprises a second transistor and a diode; the second transistor is an NPN transistor; a base of the second transistor is connected to an anode of the semi-controllable device by using the first capacitor; a collector of the second transistor is connected to a base of the first transistor; an emitter of the second transistor is connected to a cathode of the semi-controllable device; an emitter of the first transistor is a driving signal input end; a collector of the first transistor is connected to a trigger of the semi-controllable device; and the diode, the base of the second transistor, and the emitter of the second transistor are reversely connected in parallel.

In the semi-controllable device driving apparatus, the semi-controllable device is a bidirectional thyristor; the detection circuit comprises a second transistor, a third transistor, and a fourth transistor; the first transistor and the fourth transistor are NPN transistors; the second transistor and the third transistor are PNP transistors; an emitter of the second transistor is connected to a base of the third transistor; a base of the second transistor is connected to an emitter of the third transistor; the base of the second transistor is connected to a second anode of the semi-controllable device by using the first capacitor; a collector of the second transistor is connected to a base of the first transistor; the emitter of the second transistor is connected to a first anode of the semi-controllable device; a base of the fourth transistor is connected to a collector of the third transistor; a collector of the fourth transistor is connected to the emitter of the second transistor; an emitter of the fourth transistor is connected to the base of the first transistor; an emitter of the first transistor is a driving signal input end; and a collector of the first transistor is connected to a trigger of the semi-controllable device.

In the semi-controllable device driving apparatus, a first pin, a second pin, a third pin, and a fourth pin are further comprised; the semi-controllable device driving apparatus is packaged in an insulating material; the control end of the semiconductor switch is connected to the first pin by using the first capacitor; signal output ends of an output end loop of the semiconductor switch are respectively connected to the second pin and the fourth pin; and the third pin is configured to form a working loop with the semiconductor switch.

In the semi-controllable device driving apparatus, a requirement for a packaging process temperature is not lower than 125° C.

In the semi-controllable device driving apparatus, an optocoupler and a control pin are further comprised, wherein the optocoupler is packaged in the insulating material, the optocoupler is configured to control a driving signal of the semi-controllable device, and a control end of the optocoupler is connected to the control pin.

In the semi-controllable device driving apparatus, a diode and a second capacitor are further comprised, wherein the diode and the second capacitor are packaged in the insulating material; the optocoupler is configured to control the driving signal of the semi-controllable device; a signal input by an external signal source is transferred to the second pin by using the fourth pin, a rectifier of the diode, a filter of the second capacitor, and the semiconductor switch; the control end of the semiconductor switch is connected to the first pin by using the first capacitor; and the control end of the optocoupler is connected to the control pin.

In the semi-controllable device driving apparatus, a voltage regulator is further comprised, wherein the voltage regulator is packaged in the insulating material, and the voltage regulator is connected to the second capacitor in parallel, or the voltage regulator is connected to the second capacitor in parallel by using the diode.

In the semi-controllable device driving apparatus, a diode, a fifth pin, and a control pin are further comprised, wherein the diode is packaged in the insulating material; a signal input by an external signal source is transferred to the second pin by using the fourth pin, a rectifier of the diode, and the semiconductor switch; the control end of the optocoupler is connected to the control pin; the fifth pin is connected to an output end of the diode, and the fifth pin is configured to connect the second capacitor.

In the semi-controllable device driving apparatus, a voltage regulator is further comprised, wherein the voltage regulator is packaged in the insulating material, and the voltage regulator is connected to the second capacitor in parallel, or the voltage regulator is connected to the second capacitor in parallel by using the diode.

The present disclosure further describes a hybrid device, comprising any of the foregoing semi-controllable device driving apparatus, the semi-controllable device, a first electrode, a second electrode, and a third electrode, wherein the semi-controllable device driving apparatus is connected to the semi-controllable device; an internal end of the first electrode is connected to a first end of the semi-controllable device; an internal end of the second electrode is connected to a third end of the semi-controllable device; an internal end of the third electrode is connected to the semi-controllable device driving apparatus; an external driving signal is connected to a second end of the semi-controllable device by using the third electrode and the semi-controllable device driving apparatus; the semi-controllable device driving apparatus and the semi-controllable device are packaged in an insulating material; an external end of the first electrode, an external end of the second electrode, and an external end of the third electrode are connected to the outside.

A semi-controllable device driving method is provided, where a voltage detection switch is used; an input end of the voltage detection switch is connected to two ends of a semi-controllable device that needs to be driven; the voltage detection switch is connected, in series, in a driving loop of the semi-controllable device; the voltage detection switch is turned on when the potential difference at the two ends of the semi-controllable device is not greater than an on-state voltage of the semi-controllable device (it is recommended that the voltage detection switch be turned on when the potential difference at the two ends of the semi-controllable device is greater than 0 and meets a voltage direction in which the semi-controllable device is turned on); the semi-controllable device is turned on when voltage at the two ends of the semi-controllable device reaches the on-state voltage of the semi-controllable device; and the voltage detection switch is turned off after detecting that the semi-controllable device is turned on, to reduce driving power consumption of the semi-controllable device.

According to the semi-controllable device driving method of the present disclosure, a driving signal may be provided for the semi-controllable device before the potential difference at the two ends of the semi-controllable device fails to meet a conduction condition. This eliminates a conduction dead zone of the semi-controllable device caused by a response speed, and eliminates a natural driving dead zone that exists in a previous related technology because a driving signal is provided only after potential difference is greater than an on-state voltage of a semi-controllable device. In the throttling driving manner in which the voltage detection switch is turned off after detecting that the semi-controllable device is turned on, the semi-controllable device may be driven under a condition of a quite high transient driving current. The response speed of the semi-controllable device can be further improved, conduction dead zones of the semi-controllable device can be reduced, and a response frequency range of the semi-controllable device can be increased.

A semi-controllable device driving apparatus is provided, including a voltage detection switch, where an input end of the voltage detection switch is connected to two ends of a semi-controllable device that needs to be driven; the voltage detection switch is connected, in series, in a driving loop of the semi-controllable device; the voltage detection switch is turned on when potential difference at the two ends of the semi-controllable device is not greater than an on-state voltage of the semi-controllable device (it is recommended that the voltage detection switch be turned on when the potential difference at the two ends of the semi-controllable device is greater than 0 and meets a voltage direction in which the semi-controllable device is turned on); the semi-controllable device is turned on when voltage at the two ends of the semi-controllable device reaches the on-state voltage of the semi-controllable device; and the voltage detection switch is turned off after detecting that the semi-controllable device is turned on.

According to the semi-controllable device driving apparatus of the present disclosure, a driving signal may be provided for the semi-controllable device before the potential difference at the two ends of the semi-controllable device fails to meet a conduction condition. This eliminates a driving dead zone of the semi-controllable device caused by a response speed. In addition, in the throttling driving manner in which the voltage detection switch is turned off after detecting that the semi-controllable device is turned on, the semi-controllable device may be driven under a condition of a quite high transient driving current. The response speed of the semi-controllable device can be further improved. Driving dead zones of the semi-controllable device can be reduced. A response frequency range of the semi-controllable device can be increased. No insulated isolation is required between an input loop of the voltage detection switch, an output loop of the voltage detection switch, and the semi-controllable device.

A semi-controllable device driving apparatus is provided, as shown in FIG. 2, including a first capacitor C1 and a semiconductor switch (A), where voltage signal at two ends of a semi-controllable device SCR1 that needs to be driven is transferred to a control end of the semiconductor switch (A) by using the first capacitor C1, and the semiconductor switch (A) is connected, in series, in a driving loop of the semi-controllable device SCR1. Note: The first capacitor C1 and the semiconductor switch (A) are connected to form a voltage detection switch.

Working principle: For ease of understanding and description, an example in which the semi-controllable device SCR1 is connected to a diode DA in parallel is used. The voltage signal at the two ends of the semi-controllable device SCR1 is transferred to the control end of the semiconductor switch (A) by using the first capacitor C1. The semiconductor switch (A) is connected, in series, in the driving loop of the semi-controllable device SCR1. In an interval from cutoff to conduction of the semi-controllable device SCR1, there is a quite high dv/dt (a voltage change rate) at the two ends of the semi-controllable device SCR1. Because of a physical feature that voltage at two ends of a capacitor cannot change suddenly, a relatively large current passes through the first capacitor C1 (a waveform of the current passing through the first capacitor C1 and a waveform of voltage at the two ends when the semi-controllable device SCR1 is turned on are shown in FIG. 3). The current passing through the first capacitor C1 controls the semiconductor switch (A) to be turned on when potential difference at the two ends of the semi-controllable device SCR1 is less than an on-state voltage of the semi-controllable device SCR1 and a direction of the potential difference at the two ends of the semi-controllable device SCR1 meets a voltage direction in which the semi-controllable device SCR1 is turned on. A direct current driving signal input at a J4 terminal of the semiconductor switch (A) is transferred to the semi-controllable device SCR1. The semi-controllable device SCR1 is turned on when the voltage at the two ends of the semi-controllable device SCR1 reaches the on-state voltage of the semi-controllable device SCR1, to achieve an objective of driving the semi-controllable device SCR1 with an extremely small conduction dead zone or with no conduction dead zone. After the semi-controllable device SCR1 is turned on, an on-state voltage between a first end of the semi-controllable device SCR1 and a third end of the semi-controllable device SCR1 is presented as a smoothing signal, the first capacitor C1 is presented in a high-impedance state, and the semiconductor switch (A) is quickly turned off, to complete a driving process.

According to the semi-controllable device driving apparatus of the present disclosure, because of physical features that there is a quite high dv/dt (a voltage change rate) at two ends of a semi-controllable device in an interval from cutoff to conduction of the semi-controllable device, an on-state voltage of the semi-controllable device is presented as a relatively stable value after the semi-controllable device is turned on, and voltage at two ends of a capacitor cannot change suddenly, design requirements for a semiconductor switch can be greatly lowered, circuit costs can be greatly reduced, and there is an advantage of small driving energy consumption.

A hybrid device of the present disclosure includes the foregoing semi-controllable device driving apparatus and semi-controllable device, enables convenient replacement of an existing semi-controllable device, and has advantages of small driving energy consumption and no conduction dead zone or an extremely small conduction dead zone.

BRIEF DESCRIPTION OF DRAWINGS

FIG. 1 is a diagram of a waveform of voltage at two ends when a semi-controllable device driven by using a previous related technology is turned on;

FIG. 3 is a diagram of a waveform of a current passing through a capacitor when a semi-controllable device driving apparatus according to the present disclosure is used and a waveform of voltage at two ends when a semi-controllable device is turned on;

DESCRIPTION OF EMBODIMENTS

Figure 1:
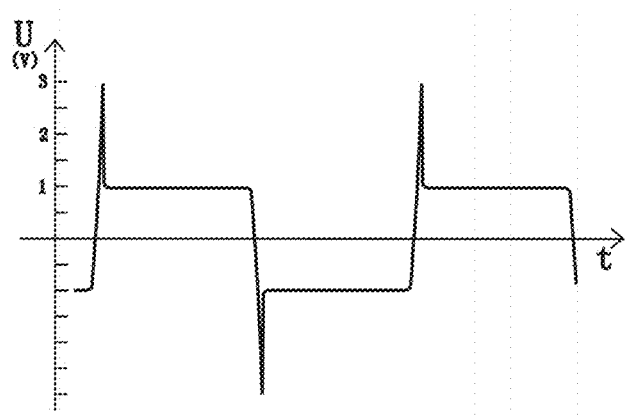
Figure 2:
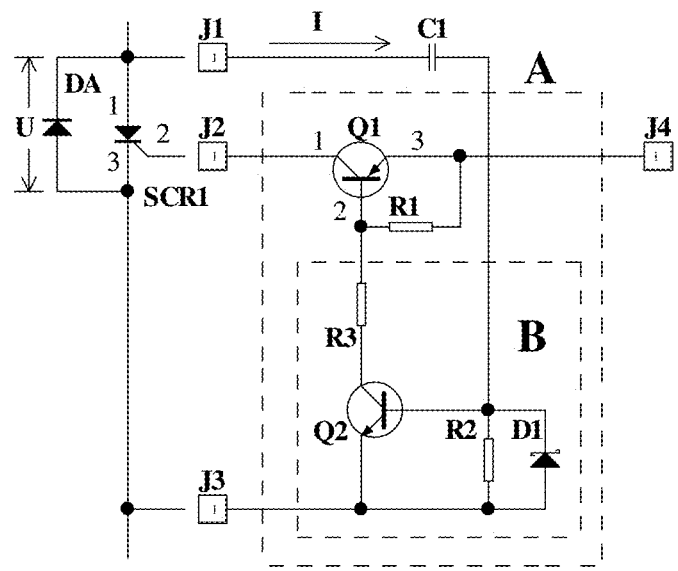
FIG. 2 is a schematic diagram 1 of a circuit of Embodiment 1 of a semi-controllable device driving apparatus according to the present disclosure.
Figure 3:
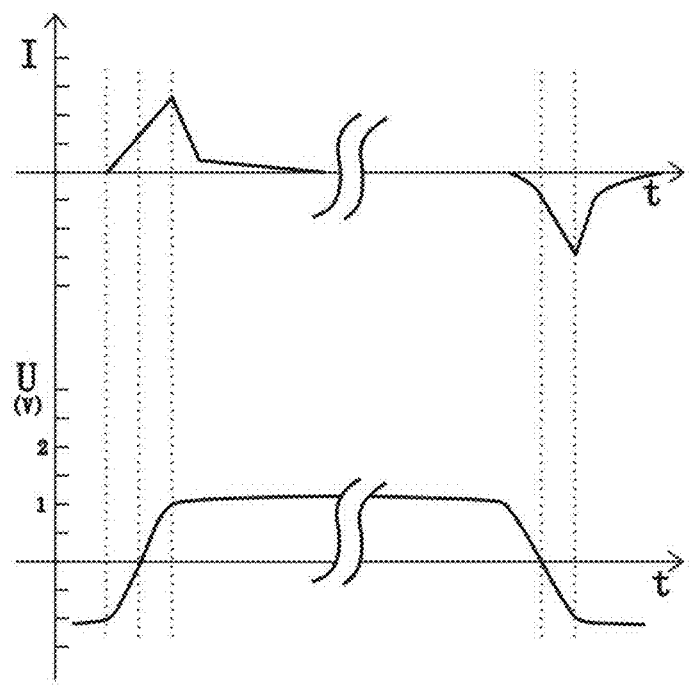

Embodiment 1 of a semi-controllable device driving apparatus of the present disclosure is shown in FIG. 2, where the semi-controllable device driving apparatus includes a first capacitor C1 and a semiconductor switch (A), where voltage signal at two ends of a semi-controllable device SCR1 (a unidirectional thyristor) that needs to be driven is transferred to a control end of the semiconductor switch (A) by using the first capacitor C1, and the semiconductor switch (A) is connected, in series, in a driving loop of the semi-controllable device SCR1. Note: The first capacitor C1 and the semiconductor switch (A) are connected to form a voltage detection switch.

Semiconductor switch (A): formed by a semiconductor device and a resistor, and including a first transistor Q1 (a triode, or an equivalent device such as a field-effect transistor), a detection circuit (B), and a first resistor R1, where the first transistor Q1 is a PNP transistor; an input end of the detection circuit (B) is connected to a first end of the semi-controllable device SCR1 by using the first capacitor C1; an output end of the detection circuit (B) is connected to a second end of the first transistor Q1; a first end of the first transistor Q1 and a third end of the first transistor Q1 are connected, in series, in the driving loop of the semi-controllable device SCR1; an emitter of the first transistor Q1 is a driving signal input end; a collector of the first transistor Q1 is connected to a trigger of the semi-controllable device SCR1; two ends of the first resistor R1 are respectively connected to the emitter of the first transistor Q1 and a base of the first transistor Q1, to improve circuit stability; and the first resistor R1 is used depending on a requirement.

Detection circuit (B): a common-emitter circuit, including a second transistor Q2, a second resistor R2, a third resistor R3, and a diode D1, where the second transistor Q2 is an NPN transistor; a base of the second transistor Q2 is connected to an anode of the semi-controllable device SCR1 by using the first capacitor C1; a collector of the second transistor Q2 is connected to the base of the first transistor Q1 by using the third resistor R3; an emitter of the second transistor Q2 is connected to a cathode of the semi-controllable device SCR1; the diode D1, the emitter of the second transistor Q2, and the base of the second transistor Q2 are connected in parallel reversely; two ends of the second resistor R2 are respectively connected to the emitter of the second transistor Q2 and the base of the second transistor Q2, to improve the circuit stability; the third resistor R3 is used for current limiting; and the second resistor R2 and the third resistor R3 are used depending on a requirement.

Working principle: For ease of understanding and description, an example in which the semi-controllable device SCR1 is connected to a diode DA in parallel is used. In an interval from cutoff to conduction of the semi-controllable device SCR1, there is a quite high dv/dt (a voltage change rate) at the two ends of the semi-controllable device SCR1. Because of a physical feature that voltage at two ends of a capacitor cannot change suddenly, a relatively large current passes through the first capacitor C1. The current passing through the first capacitor C1 is amplified by the detection circuit (B) and drives the first transistor Q1 to be turned on when potential difference at the two ends of the semi-controllable device SCR1 is less than an on-state voltage (generally from 1.1 V to 1.9 V) of the semi-controllable device SCR1, a direction of the potential difference at the two ends of the semi-controllable device SCR1 meets a voltage direction in which the semi-controllable device SCR1 is turned on, and the potential difference is greater than a turn-on voltage (about 0.7 V) of the second transistor Q2 of the detection circuit (B). A direct current driving signal input at a J4 terminal of the first transistor Q1 is transferred to the semi-controllable device SCR1. The semi-controllable device SCR1 is turned on when the voltage at the two ends of the semi-controllable device SCR1 reaches the on-state voltage of the semi-controllable device SCR1, to achieve an objective of driving the semi-controllable device SCR1 with an extremely small conduction dead zone or with no conduction dead zone. After the semi-controllable device SCR1 is turned on, an on-state voltage between a first end (the anode) of the semi-controllable device SCR1 and a third end (the cathode) of the semi-controllable device SCR1 is presented as a smoothing signal, the first capacitor C1 is presented in a high-impedance state, the second transistor Q2 is turned off, and the first transistor Q1 is turned off, to complete a driving process.

Figure 4:
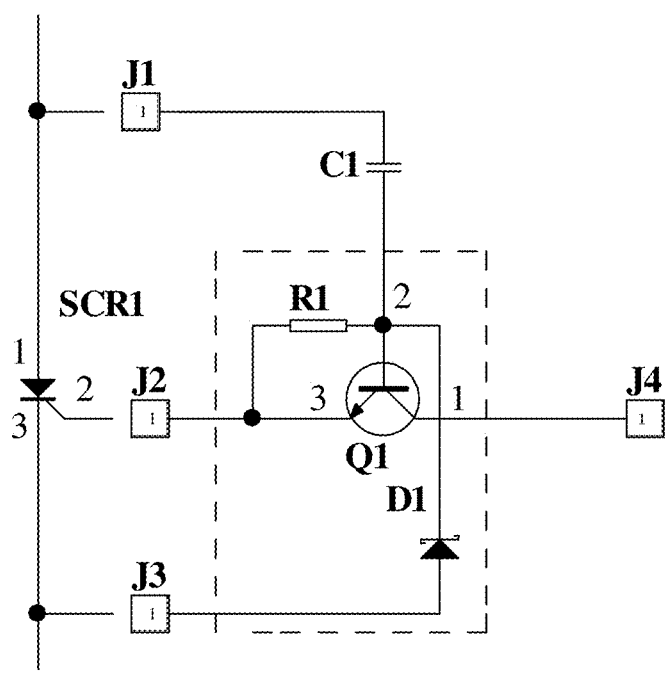
FIG. 4 is a schematic diagram 2 of a circuit of Embodiment 1 of a semi-controllable device driving apparatus according to the present disclosure.
Figure 5:
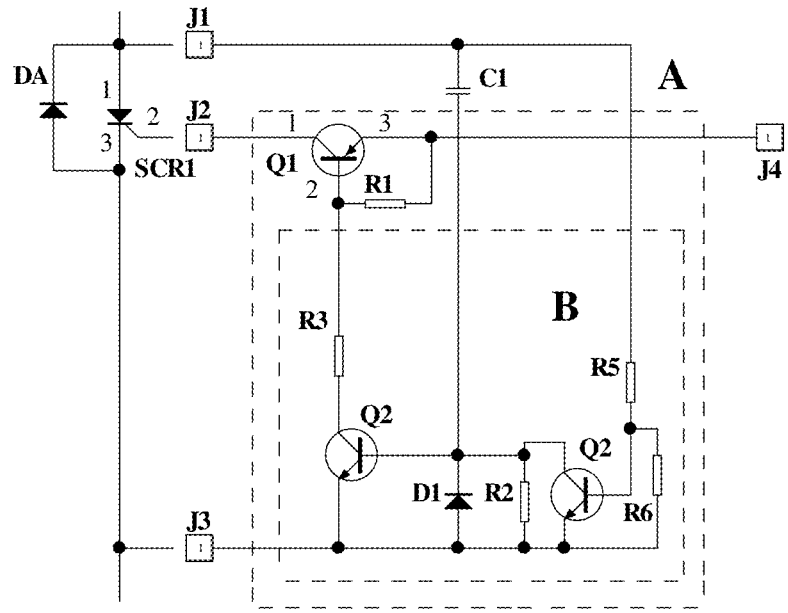
FIG. 5 is a schematic diagram 3 of a circuit of Embodiment 1 of a semi-controllable device driving apparatus according to the present disclosure.

In this embodiment, a voltage signal between the first end of the semi-controllable device SCR1 (the unidirectional thyristor) and the third end of the semi-controllable device SCR1 (the unidirectional thyristor) is transferred to the control end of the semiconductor switch (A) by using the first capacitor C1. In actual use, alternatively, a voltage signal between the first end of the semi-controllable device SCR1 (the unidirectional thyristor) and a second end of the semi-controllable device SCR1 (the unidirectional thyristor) may be transferred to the control end of the semiconductor switch (A) by using the first capacitor C1, as shown in FIG. 4. When zero-crossing driving is required, a related assistant circuit may be further added, as shown in FIG. 5.

Figure 6:
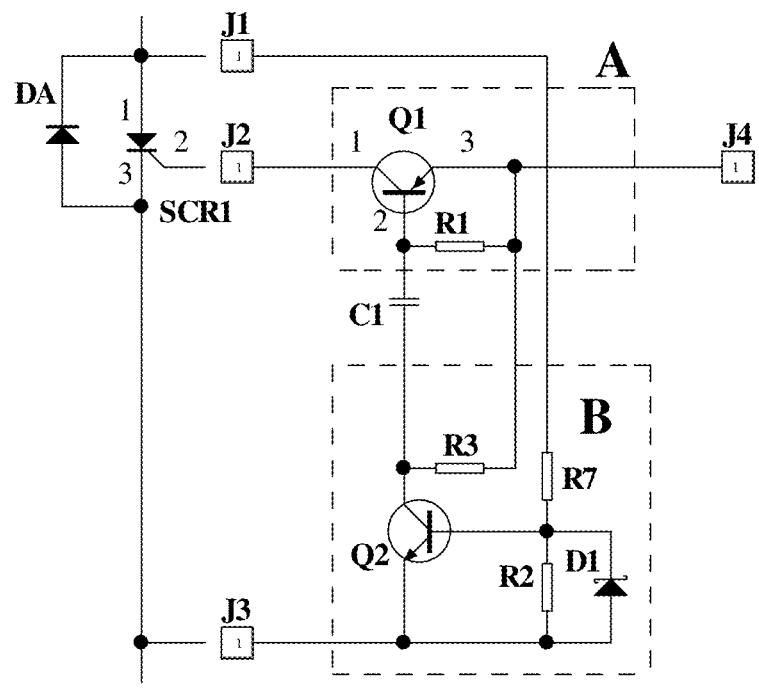
FIG. 6 is a schematic diagram of a circuit of Embodiment 2 of a semi-controllable device driving apparatus according to the present disclosure.

Embodiment 2 of a semi-controllable device driving apparatus of the present disclosure is shown in FIG. 6, where the semi-controllable device driving apparatus includes a first capacitor C1, a semiconductor switch (A), and a detection circuit (B), where the semiconductor switch (A) is a first transistor Q1; voltage signal at two ends of a semi-controllable device SCR1 (a unidirectional thyristor) that needs to be driven is transferred to a control end of the semiconductor switch (A) by using the detection circuit (B) and the first capacitor C1; the semiconductor switch (A) is connected, in series, in a driving loop of the semi-controllable device SCR1; an input end of the detection circuit (B) is connected to a first end of the semi-controllable device SCR1; an output end of the detection circuit (B) is connected to a second end of the first transistor Q1 by using the first capacitor C1; and a first end of the first transistor Q1 and a third end of the first transistor Q1 are connected, in series, in the driving loop of the semi-controllable device SCR1.

Semiconductor switch (A): formed by the first transistor Q1 (a semiconductor device) and a first resistor R1, where the first transistor Q1 is a PNP transistor; an emitter of the first transistor Q1 is a driving signal input end; a collector of the first transistor Q1 is connected to a trigger of the semi-controllable device SCR1; and two ends of the first resistor R1 are respectively connected to the emitter of the first transistor Q1 and a base of the first transistor Q1, to improve circuit stability.

Detection circuit (B): a common-emitter circuit, including a second transistor Q2, a seventh resistor R7, a diode D1, a second resistor R2, and a third resistor R3, where the second transistor Q2 is an NPN transistor; a base of the second transistor Q2 is connected to an anode of the semi-controllable device SCR1 by using the seventh resistor R7; a collector of the second transistor Q2 is connected to the base of the first transistor Q1 by using the first capacitor C1; an emitter of the second transistor Q2 is connected to a cathode of the semi-controllable device SCR1; the diode D1, the emitter of the second transistor Q2, and the base of the second transistor Q2 are connected in parallel reversely; the second resistor R2 is connected to the diode D1 in parallel; and the third resistor R3 is a discharge resistor of the first capacitor C1.

Working principle: For ease of understanding and description, an example in which the semi-controllable device SCR1 is connected to a diode DA in parallel is used. The detection circuit (B) controls, by using the first capacitor C1, the semiconductor (A) to be turned on when voltage at the two ends of the semi-controllable device SCR1 is less than the on-state voltage of the semi-controllable device SCR1 and a positive voltage reaches a turn-on voltage (about 0.7 V) of the second transistor Q2 of the detection circuit (B). A direct current driving signal input at a J4 terminal connected to the first transistor Q1 is transferred to the semi-controllable device SCR1. The semi-controllable device SCR1 is turned on when the voltage at the two ends of the semi-controllable device SCR1 reaches the on-state voltage of the semi-controllable device SCR1, to achieve an objective of driving the semi-controllable device SCR1 with an extremely small conduction dead zone or with no conduction dead zone. After the semi-controllable device SCR1 is turned on, an on-state voltage between a first end (the anode) of the semi-controllable device SCR1 and a third end (the cathode) of the semi-controllable device SCR1 is presented as a smoothing signal, the first capacitor C1 is presented in a high-impedance state, and the first transistor Q1 is turned off, to complete a driving process.

Figure 7:
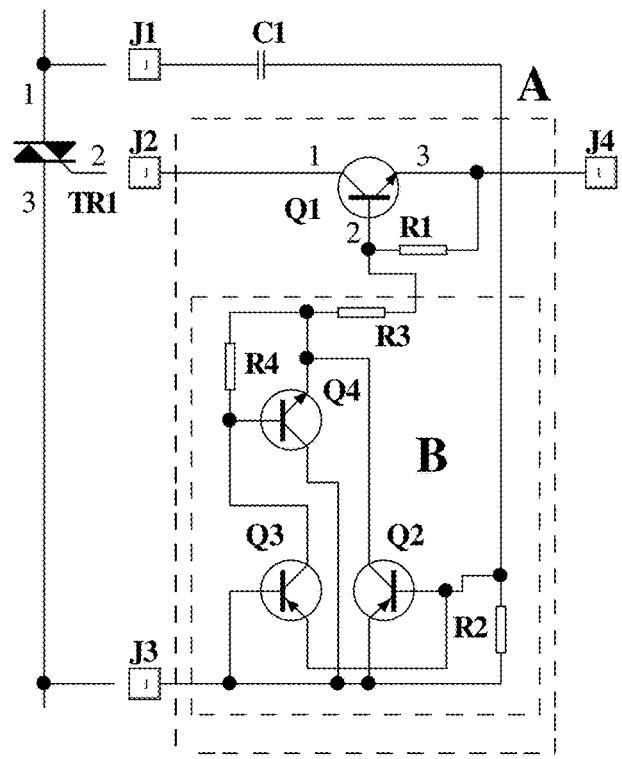
FIG. 7 is a schematic diagram of a circuit of Embodiment 3 of a semi-controllable device driving apparatus according to the present disclosure.

Embodiment 3 of a semi-controllable device driving apparatus of the present disclosure is shown in FIG. 7, where the semi-controllable device driving apparatus includes a first capacitor C1 and a semiconductor switch (A), where voltage signal at two ends of a semi-controllable device TR1 (a bidirectional thyristor) that needs to be driven is transferred to a control end of the semiconductor switch (A) by using the first capacitor C1, and the semiconductor switch (A) is connected, in series, in a driving loop of the semi-controllable device TR1. Note: The first capacitor C1 and the semiconductor switch (A) are connected to form a voltage detection switch.

Semiconductor switch (A): formed by a semiconductor device and a resistor, and including a first transistor Q1, a first resistor R1, and a detection circuit (B), where the first transistor Q1 is a PNP transistor; an input end of the detection circuit (B) is connected to a first end of the semi-controllable device TR1 by using the first capacitor C1; an output end of the detection circuit (B) is connected to a second end of the first transistor Q1; a first end of the first transistor Q1 and a third end of the first transistor Q1 are connected, in series, in the driving loop of the semi-controllable device TR1; an emitter of the first transistor Q1 is a driving signal input end; a collector of the first transistor Q1 is connected to a trigger of the semi-controllable device TR1; two ends of the first resistor R1 are respectively connected to the emitter of the first transistor Q1 and a base of the first transistor Q1, to improve circuit stability.

Detection circuit (B): including a second transistor Q2, a third transistor Q3, a fourth transistor Q4, a second resistor R2, a third resistor R3, and a fourth resistor R4, where the fourth transistor Q4 is an NPN transistor; the second transistor Q2 and the third transistor Q3 are PNP transistors; an emitter of the second transistor Q2 is connected to a base of the third transistor Q3; a base of the second transistor Q2 is connected to an emitter of the third transistor Q3; the base of the second transistor Q2 is connected to a second anode (the first end) of the semi-controllable device TR1 by using the first capacitor C1; a collector of the second transistor Q2 is connected to the base of the first transistor Q1; the emitter of the second transistor Q2 is connected to a first anode (the third end) of the semi-controllable device TR1; a base of the fourth transistor Q4 is connected to a collector of the third transistor Q3; a collector of the fourth transistor Q4 is connected to the emitter of the second transistor Q2; an emitter of the fourth transistor Q4 is connected to the base of the first transistor Q1; the second transistor Q2 is a common-emitter circuit; the fourth transistor Q4 is configured to further amplify a signal output by the third transistor Q3, so that the detection circuit (B) symmetrically amplifies positive and negative waves of the signal; two ends of the second resistor R2 are respectively connected to the emitter of the second transistor Q2 and the base of the second transistor Q2, and two ends of the fourth resistor R4 are respectively connected to the emitter of the fourth transistor Q4 and the base of the fourth transistor Q4, to improve circuit stability; the third resistor R3 is connected, in series, to the output end of the detection circuit (B) for current limiting; and the second resistor R2, the third resistor R3, and the fourth resistor R4 are used depending on a requirement.

Working principle: In an interval from cutoff to conduction of the semi-controllable device TR1, there is a quite high dv/dt (a voltage change rate) at the two ends of the semi-controllable device TR1. Because of a physical feature that voltage at two ends of a capacitor cannot change suddenly, a relatively large current passes through the first capacitor C1. The current passing through the first capacitor C1 is amplified by the detection circuit (B) and drives the first transistor Q1 to be turned on when the potential difference at the two ends of the semi-controllable device TR1 is less than an on-state voltage (about 1.1 V to 1.9 V) of the semi-controllable device TR1, a direction of the potential difference at the two ends of the semi-controllable device TR1 meets a voltage direction in which the semi-controllable device TR1 is turned on, and the potential difference is greater than a turn-on voltage (about 0.7 V) of the second transistor Q2 or the third transistor Q3 of the detection circuit (B). A direct current driving signal input at a J4 terminal connected to the emitter of the first transistor Q1 is transferred to the semi-controllable device TR1. The semi-controllable device TR1 is turned on when the voltage at the two ends of the semi-controllable device TR1 reaches the on-state voltage of the semi-controllable device TR1, to achieve an objective of driving the semi-controllable device TR1 with an extremely small conduction dead zone or with no conduction dead zone. After the semi-controllable device TR1 is turned on, an on-state voltage between the first end (the second anode) of the semi-controllable device TR1 and the third end (the first anode) of the semi-controllable device TR1 is presented as a smoothing signal, the first capacitor C1 is presented in a high-impedance state, the second transistor Q2 is turned off (or the third transistor Q3 is turned off), and the first transistor Q1 is turned off, to complete a driving process.

Figure 8:
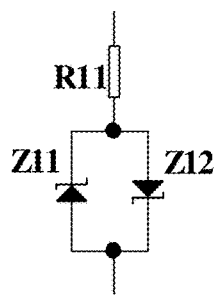
FIG. 8 is a schematic diagram of a circuit in which a resistor and a semiconductor device of a semi-controllable device driving apparatus according to the present disclosure are connected in series.
Figure 9:
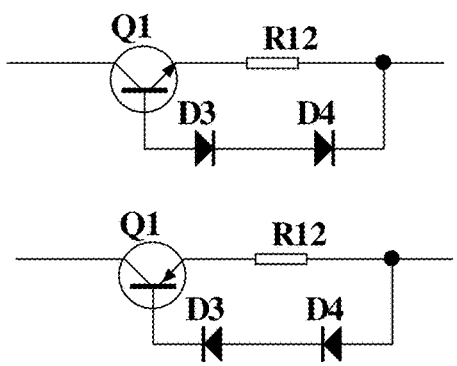
FIG. 9 is a schematic diagram of a constant current circuit of a semi-controllable device driving apparatus according to the present disclosure.

Note: The first capacitor C1 may be connected, in parallel, to a series circuit (as shown in FIG. 8) of a resistor and semiconductor devices, to mitigate impact of a voltage rise rate in an interval from a zero point to conduction of the semi-controllable device when the semi-controllable device (the thyristor) is configured to control a relatively low alternating current voltage or a relatively small load current. A current passing through the series circuit is used to control the semiconductor switch to be turned on when the potential difference at the two ends of the semi-controllable device is greater than the on-state voltage of the semi-controllable device. To further reduce power consumption, the first transistor Q1 of the semiconductor switch may be replaced with a constant current circuit shown in FIG. 9. In the foregoing embodiment, because of a physical feature that voltage at two ends of a capacitor cannot change suddenly, a current passing through the capacitor is the largest from cutoff of the semi-controllable device to conduction of the semi-controllable device, that is, when a voltage inflection point is to occur at the two ends of the semi-controllable device. In this case, the semiconductor switch may obtain a largest driving current. In addition, after the thyristor is turned on, the on-state voltage of the thyristor is presented as a relatively straight waveform, which is equivalent to a direct current voltage. In this case, a current passing through the capacitor is nearly zero. The semiconductor switch amplifies the current passing through the first capacitor C1. A requirement for a capacity of the first capacitor is low. Under a general working condition, a satisfying effect can be achieved with only 1 nF to 47 nF (a chip ceramic capacitor may be used). The first capacitor C1 may alternatively be connected to a current limiting resistor in series. A recommended resistance value is about 10 ohms. The capacity of the first capacitor C1 and the resistance value of the current limiting resistor connected to the first capacitor C1 in series should not be too large. The semiconductor switch is merely a circuit including a transistor and a resistor. The circuit is simple, and its cost is low. In actual application, a control port may be added. This still falls in the protection scope of this patent.

Figure 10:
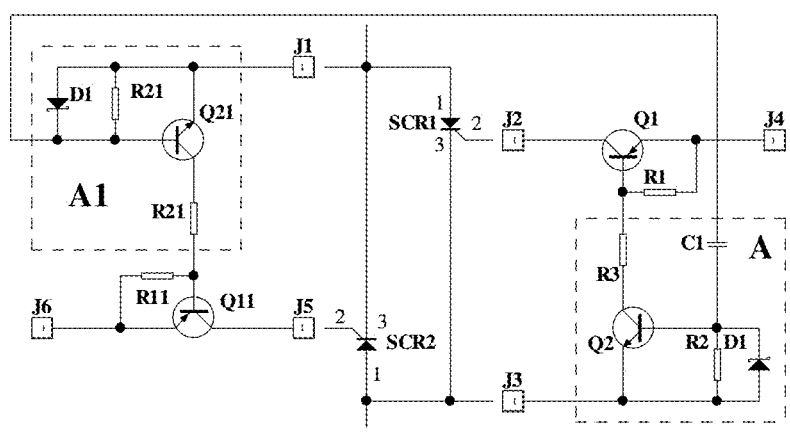
FIG. 10 is a schematic diagram of a driving circuit, of semi-controllable devices connected in parallel reversely, of a semi-controllable device driving apparatus according to the present disclosure.

The first capacitor C1 may be reused when it is configured to drive two semi-controllable devices that are connected in parallel reversely, as shown in FIG. 10. A working principle is the same. This still falls in the protection scope of the present disclosure.

Figure 11:
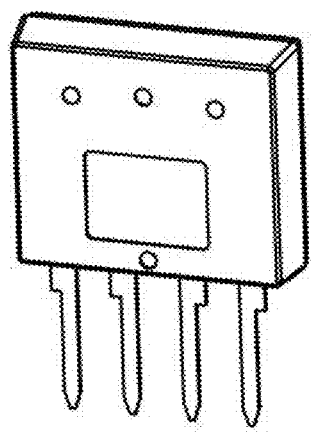
FIG. 11 is a schematic diagram of a package of a semi-controllable device driving apparatus according to the present disclosure.

For ease of use, the foregoing semi-controllable device driving apparatus of the present disclosure may be packaged as a whole, as shown in FIG. 11, including the foregoing semi-controllable device driving apparatus, and further including a first pin J1, a second pin J2, a third pin J3, and a fourth pin J4. The semi-controllable device driving apparatus is packaged in an insulating material. A control end of a semiconductor switch is connected to the first pin J1 by using a first capacitor. Signal output ends of an output end loop of the semiconductor switch are respectively connected to the second pin J2 and the fourth pin J4. The third pin J3 is connected to the semiconductor switch to form a working loop.

Figure 12:
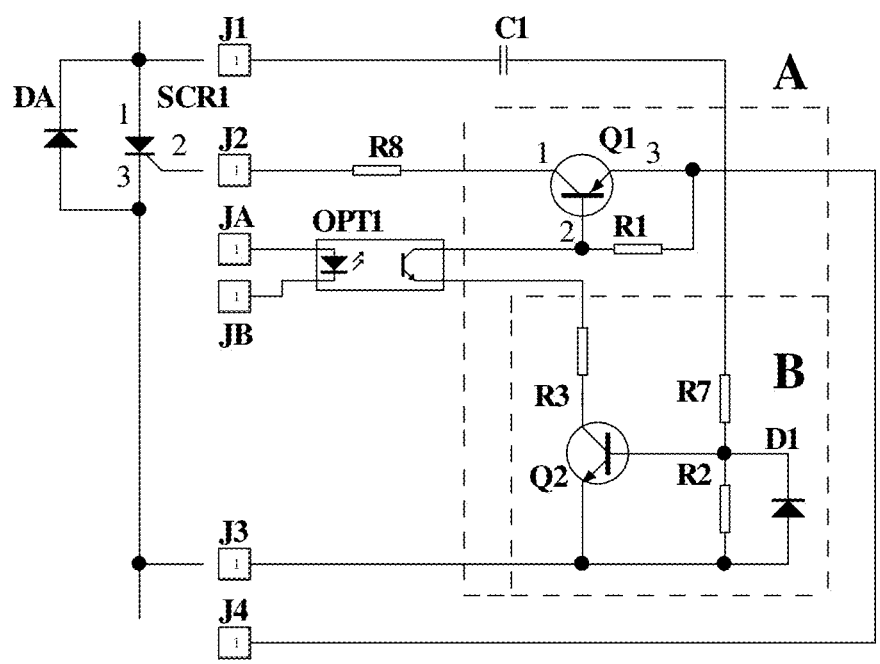
FIG. 12 is a schematic diagram of a circuit of Embodiment 4 of a semi-controllable device driving apparatus according to the present disclosure.
Figure 13:
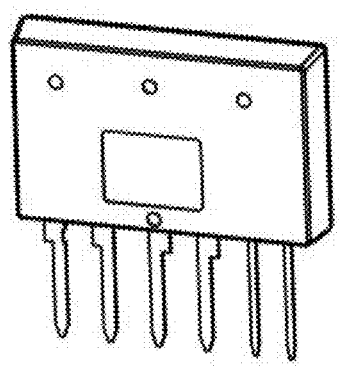
FIG. 13 is a diagram of a package of Embodiment 4 of a semi-controllable device driving apparatus according to the present disclosure.

A schematic diagram of Embodiment 4 of a semi-controllable device driving apparatus of the present disclosure is shown in FIG. 12, where for ease of use and control, the embodiment includes the foregoing semi-controllable device driving apparatus, and further includes a first pin J1, a second pin J2, a third pin J3, a fourth pin J4, an optocoupler OPT1, and control pins (JA and JB), where a control end of a semiconductor switch (A) is connected to the first pin J1 by using a first capacitor C1; signal output ends of an output loop of the semiconductor switch (A) are respectively connected to the second pin J2 and the fourth pin J4; the third pin J3 is connected to the semiconductor switch (A) to form a working loop; the optocoupler OPT1 is configured to control a driving signal of a semi-controllable device; a control end of the optocoupler OPT1 is connected to the control pins (JA and JB); and the optocoupler OPT1 and the semi-controllable device SCR1 driving apparatus are packaged in an insulating material, as shown in FIG. 13.

Figure 14:
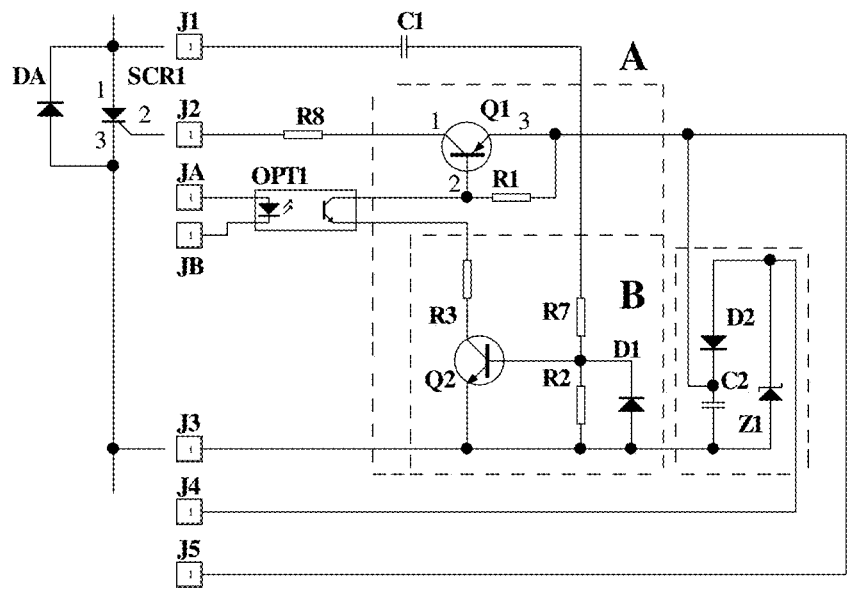
FIG. 14 is a schematic diagram of a circuit of Embodiment 5 of a semi-controllable device driving apparatus according to the present disclosure.
Figure 15:
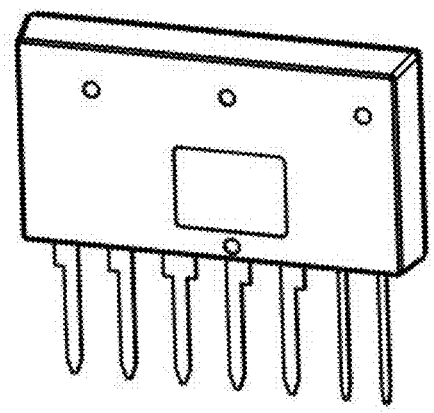
FIG. 15 is a schematic diagram of a package of Embodiment 5 of a semi-controllable device driving apparatus according to the present disclosure.

A schematic diagram of Embodiment 5 of a semi-controllable device driving apparatus of the present disclosure is shown in FIG. 14, where for ease of use and control and improving commonality, the embodiment includes the foregoing semi-controllable device driving apparatus, and further includes a first pin J1, a second pin J2, a third pin J3, a fourth pin J4, an optocoupler OPT1, a voltage regular Z1, a second capacitor C2, a diode D2, and control pins (JA and JB), where a control end of a semiconductor switch is connected to the first pin J1 by using a first capacitor; signal output ends of an output loop of the semiconductor switch (A) are respectively connected to the second pin J2 and the fourth pin J4; the optocoupler OPT1 is configured to control a driving signal of a semi-controllable device SCR1; a control end of the optocoupler OPT1 is connected to the control pins (JA and JB); a signal input by an external signal source is transferred to the second pin J2 by using the fourth pin J4, a rectifier of the diode D2, a filter of the second capacitor C2, and the semi-controllable device driving apparatus; the control end of the semiconductor switch (A) is connected to the first pin J1 by using the first capacitor C1; the third pin J3 is connected to the semiconductor switch (A) to form a working loop; the voltage regulator Z1 is connected, in parallel, to the second capacitor C2 by using the diode D2 (or the voltage regulator Z1 is directly connected to the second capacitor C2 in parallel); and the diode D2, the second capacitor C2, the optocoupler OPT1, the voltage regulator Z1, and the semi-controllable device driving apparatus are packaged in an insulating material (a component may be added or removed depending on a requirement), as shown in a schematic diagram of a package in FIG. 13; and if an external capacitor needs to be added or the second capacitor C2 needs to be deployed externally, a fifth pin J5 may be added, where the fifth pin J5 is connected to an output end of the diode D2, and the fifth pin J5 is configured to connect the second capacitor C2 or the external capacitor, as shown in a schematic diagram of a package in FIG. 15.

In the foregoing embodiment, the semiconductor switch (A) is a semiconductor switch circuit. A working power supply of the semiconductor switch (A) circuit is provided by a direct current driving signal, and no external working power supply needs to be connected. Because the semi-controllable device driving apparatus of the present disclosure has a throttling driving function, the second capacitor C2 may be a 1-10 µF chip ceramic capacitor, and a plurality of small-capacity capacitors may be connected in parallel for use. In this embodiment, a power supply of the fourth pin J4 may be directly (without isolation by a transformer) provided (for example, by using a neutral line, or another phase power supply relative to the semi-controllable device), by using a current limiting resistor, by a power grid in which the semi-controllable device is located. The current limiting resistor may be packaged together. A working principle is the same. This still falls in the protection scope of the present disclosure.

Figure 16:
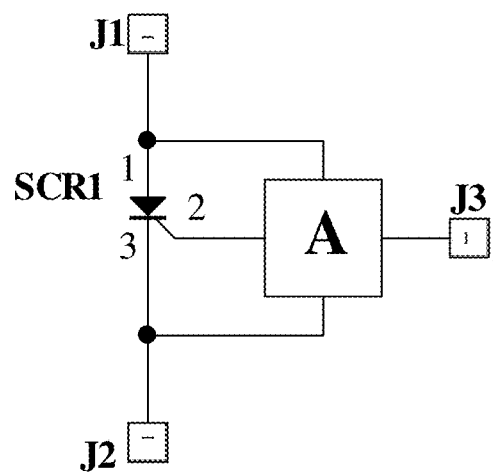
FIG. 16 is a schematic structural diagram of a hybrid device according to the present disclosure.
Figure 17:
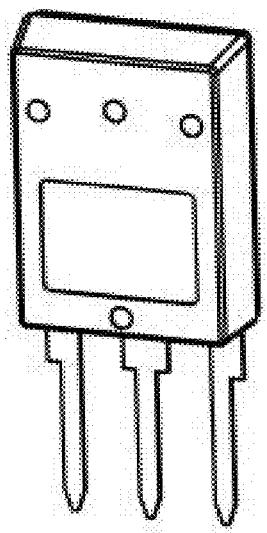
FIG. 17 is a schematic diagram of a package of a hybrid device according to the present disclosure.

A hybrid device is shown in FIG. 16, where the hybrid device includes the foregoing semi-controllable device driving apparatus (A), a semi-controllable device SCR1, a first electrode J1, a second electrode J2, and a third electrode J3, where the semi-controllable device driving apparatus (A) is connected to the semi-controllable device SCR1; an internal end of the first electrode J1 is connected to a first end of the semi-controllable device SCR1; an internal end of the second electrode J2 is connected to a third end of the semi-controllable device SCR1; an internal end of the third electrode J3 is connected to the semi-controllable device driving apparatus (A); an external driving signal is connected to a second end of the semi-controllable device SCR1 by using the third electrode J3 and the semi-controllable device driving apparatus (A); the semi-controllable device driving apparatus (A) and the semi-controllable device SCR1 are packaged in an insulating material; and an external end of the first electrode J1, an external end of the second electrode J2, and an external end of the third electrode J3 are connected to the outside, as shown in a schematic diagram of a package shown in FIG. 17; therefore, commonality is good, an existing semi-controllable device such as a conventional unidirectional thyristor or bidirectional thyristor can be conveniently replaced, and objectives of no conduction dead zone or an extremely small conduction dead zone and a small driving current are achieved.

In the foregoing embodiments, a requirement for a packaging process temperature may be up to 185° C. for packaging (it is recommended that a lowest temperature be not lower than 125° C. for packaging). In the present disclosure, pins are not marked in a schematic diagram of a package, because a pin arrangement sequence and a connection relationship between the pins and a corresponding circuit may be randomly arranged depending on a process and an external accessory product. In addition, an outline of a package is not limited, and an existing conventional package outline and pin manner may be adopted.

To sum up, the present disclosure has the following advantages:

1. A circuit is simple, reliability is high, a volume is small, power consumption is small, and costs are low.

2. A semiconductor switch is turned on in advance when the potential difference is not greater than an on-state voltage of a semi-controllable device. This eliminates a driving dead zone that objectively exists in a previous related technology, and eliminates a driving dead zone of the semi-controllable device caused by a response speed counted from obtaining a driving signal by the semi-controllable device to conduction of the semi-controllable device. Therefore, the semi-controllable device has no conduction dead zone or has an extremely small conduction dead zone, and harmonic pollution and interference on a power grid are greatly reduced. In addition, a throttling effect is achieved, and energy consumption and a volume of a driving source are reduced.

3. A first capacitor is used as a coupler. The first capacitor has no active power consumption. Because of physical features that a voltage change rate of voltage at two ends of the semi-controllable device is high in an interval from cutoff to conduction, and the voltage at the two ends of the semi-controllable device is presented as a relatively straight waveform after the semi-controllable device is turned on, before the semi-controllable device is turned on, a capacitive reactance of a capacitor is small, and a current passing through the capacitor is large. Therefore, the semi-controllable device is easily controlled to be turned on with no dead zone or with an extremely small dead zone. After the semi-controllable device is turned on, the current passing through the capacitor can be held for a specific working time (to achieve conduction stability of the semi-controllable device), then the capacitive reactance of the capacitor quickly tends to be infinite, and the semiconductor switch is quickly turned off, to achieve functions of no dead zone or an extremely small dead zone and throttling driving.

4. A requirement for a capacity of the first capacitor is extremely low. The capacity may be from 1 nF to 47 nF. A chip ceramic capacitor may be used. A volume of the capacitor is small, and the capacitor can be packaged conveniently.

5. A hybrid device of the present disclosure may be packaged according to a package form of an existing conventional semi-controllable device, can conveniently replace the existing conventional semi-controllable device, and has advantages of a small conduction dead zone or no conduction dead zone and a small average driving current.

What is claimed is:

1. A semi-controllable device driving apparatus, comprising a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned when the semi-controllable device is on, wherein there is no insulated isolation between an input loop of the voltage detection switch, an output loop of the voltage detection switch, and the semi-controllable device; and the voltage detection switch is turned on when the potential difference at the two ends of the semi-controllable device is greater than 0 and meets a voltage direction in which the semi-controllable device is turned on.

2. A semi-controllable device driving apparatus, comprising a first capacitor and a semiconductor switch; the first capacitor and the semiconductor switch compose a voltage detection switch; voltage signal at the two ends of a semi-controllable device that needs to be driven is transferred to a control end of the semiconductor switch by using the first capacitor; and the semiconductor switch is connected, in series, in the driving loop of the semi-controllable device; the semiconductor switch is turned on when the potential difference at the two ends of the semi-controllable device is not greater than an on-state voltage of the semi-controllable device; and the semiconductor switch is turned off when the semi-controllable device is on,
wherein:
the semiconductor switch comprises a first transistor and a detection circuit;
an input end of the detection circuit is connected to a first end of the semi-controllable device by using the first capacitor;
an output end of the detection circuit is connected to a second end of the first transistor; and
a first end of the first transistor and a third end of the first transistor are connected, in series, in the driving loop of the semi-controllable device.

3. The semi-controllable device driving apparatus according to claim 2, wherein the semi-controllable device is a unidirectional thyristor or a bidirectional thyristor.

4. The semi-controllable device driving apparatus according to claim 2, wherein the semi-controllable device is a unidirectional thyristor; the first transistor is a PNP transistor; the detection circuit comprises a second transistor and a diode; the second transistor is an NPN transistor; a base of the second transistor is connected to an anode of the semi-controllable device by using the first capacitor; a collector of the second transistor is connected to a base of the first transistor; an emitter of the second transistor is connected to a cathode of the semi-controllable device; an emitter of the first transistor is a driving signal input end; a collector of the first transistor is connected to a trigger of the semi-controllable device; and the diode, the base of the second transistor, and the emitter of the second transistor are reversely connected in parallel.

5. The semi-controllable device driving apparatus according to claim 2, wherein the semi-controllable device is a bidirectional thyristor; the detection circuit comprises a second transistor, a third transistor, and a fourth transistor; the first transistor and the fourth transistor are NPN transistors; the second transistor and the third transistor are PNP transistors; an emitter of the second transistor is connected to a base of the third transistor; a base of the second transistor is connected to an emitter of the third transistor; the base of the second transistor is connected to a second anode of the semi-controllable device by using the first capacitor; a collector of the second transistor is connected to a base of the first transistor; the emitter of the second transistor is connected to a first anode of the semi-controllable device; a base of the fourth transistor is connected to a collector of the third transistor; a collector of the fourth transistor is connected to the emitter of the second transistor; an emitter of the fourth transistor is connected to the base of the first transistor; an emitter of the first transistor is a driving signal input end; and a collector of the first transistor is connected to a trigger of the semi-controllable device.

6. A semi-controllable device driving apparatus, comprising:
a first capacitor and a semiconductor switch, wherein:
the first capacitor and the semiconductor switch compose a voltage detection switch;
a voltage signal at the two ends of a semi-controllable device that needs to be driven is transferred to a control end of the semiconductor switch by using the first capacitor;
the semiconductor switch is connected, in series, in the driving loop of the semi-controllable device;
the semiconductor switch is turned on when the potential difference at the two ends of the semi-controllable device is not greater than an on-state voltage of the semi-controllable device; and
the semiconductor switch is turned off when the semi-controllable device is on,
a first pin,
a second pin, a third pin, and a fourth pin;
wherein:
the semi-controllable device driving apparatus is packaged in an insulating material;
the control end of the semiconductor switch is connected to the first pin by using the first capacitor;
signal output ends of an output end loop of the semiconductor switch are respectively connected to the second pin and the fourth pin; and
the third pin is configured to form a working loop with the semiconductor switch.

7. A hybrid device, comprising the semi-controllable device driving apparatus comprising:
a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned when the semi-controllable device is on, the semi-controllable device, a first electrode, a second electrode, and a third electrode, wherein:

the semi-controllable device driving apparatus is connected to the semi-controllable device;

an internal end of the first electrode is connected to a first end of the semi-controllable device;

an internal end of the second electrode is connected to a third end of the semi-controllable device;

an internal end of the third electrode is connected to the semi-controllable device driving apparatus;

an external driving signal is connected to a second end of the semi-controllable device by using the third electrode and the semi-controllable device driving apparatus;

the semi-controllable device driving apparatus and the semi-controllable device are packaged in an insulating material; and an external end of the first electrode, an external end of the second electrode, and an external end of the third electrode are connected to the outside.

8. A semi-controllable device driving apparatus, comprising a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned when the semi-controllable device is on, wherein the voltage detection switch comprises four ports, three of the ports are respectively connected to three ends of the semi-controllable device, and the other port is configured to input a driving signal.

9. A semi-controllable device driving apparatus, comprising a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned when the semi-controllable device is on, wherein the semi-controllable device is turned on after the voltage detection switch is turned on and when voltage at two ends of a main loop of the semi-controllable device reaches the on-state voltage.

10. A semi-controllable device driving apparatus, comprising a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned when the semi-controllable device is on, wherein the two ends of the semi-controllable device are two ends of a main loop of the semi-controllable device, or the two ends of the semi-controllable device are a first end of the semi-controllable device and a second end of a main loop of the semi-controllable device.

11. A semi-controllable device driving apparatus, comprising a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned when the semi-controllable device is on, wherein the voltage detection switch is configured to perform continuous driving throttling control with no dead zone or with a small dead zone on the semi-controllable device.

12. A semi-controllable device driving apparatus, comprising a voltage detection switch, wherein an input end of the voltage detection switch is connected to two ends of a semi-controllable device that needs to be driven; the voltage detection switch is connected, in series, in a driving loop of the semi-controllable device; the voltage detection switch is turned on when a potential difference at the two ends of the semi-controllable device is not greater than an on-state voltage of the semi-controllable device; and the voltage detection switch is turned when the semi-controllable device is on, wherein a working power supply of the voltage detection switch is provided by a driving signal source of the semi-controllable device, and the driving signal source is a direct current power supply.

13. The semi-controllable device driving apparatus according to claim 12, wherein the direct current power supply is provided in a non-electric isolation manner by a power grid in which the semi-controllable device is located.

* * * * *